United States Patent
Zweigle et al.

(10) Patent No.: US 9,835,247 B2
(45) Date of Patent: Dec. 5, 2017

(54) GEARBOX CONTROL MODULE

(71) Applicant: Robert Bosch GmbH, Stuttgart (DE)

(72) Inventors: Peter Zweigle, Ditzingen (DE); Holger Braun, Stuttgart (DE); Michael Kircher, Steinheim an der Murr (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 14/363,265

(22) PCT Filed: Oct. 11, 2012

(86) PCT No.: PCT/EP2012/070174
§ 371 (c)(1),
(2) Date: Jun. 5, 2014

(87) PCT Pub. No.: WO2013/083318
PCT Pub. Date: Jun. 13, 2013

(65) Prior Publication Data
US 2014/0318296 A1 Oct. 30, 2014

(30) Foreign Application Priority Data
Dec. 8, 2011 (DE) .................. 10 2011 088 031

(51) Int. Cl.
*F16H 61/02* (2006.01)
*F16H 61/00* (2006.01)
*H05K 5/00* (2006.01)

(52) U.S. Cl.
CPC ..... *F16H 61/0202* (2013.01); *F16H 61/0006* (2013.01); *H05K 5/0082* (2013.01); *Y10T 74/2003* (2015.01)

(58) Field of Classification Search
CPC . F16H 2057/02026; F16H 2057/02034; F16H 2057/0203; F16H 2057/02047;
(Continued)

(56) References Cited

U.S. PATENT DOCUMENTS 5,287,759 A 2/1994 Kaneda
5,707,243 A * 1/1998 Endo .................. B60R 16/0239
439/688
(Continued)

FOREIGN PATENT DOCUMENTS

CN 1894121 A 1/2007
DE 4225358 A1 * 2/1994 ......... B60R 16/0239
(Continued)

OTHER PUBLICATIONS

International Search Report corresponding to PCT Application No. PCT/EP2012/070174, dated Dec. 21, 2012 (German and English language document) (7 pages).

*Primary Examiner* — Thomas C Diaz
(74) *Attorney, Agent, or Firm* — Maginot, Moore & Beck LLP

(57) ABSTRACT

A gearbox control module for a gearbox comprises an electronic component with an electronic circuit configured to control the gearbox, electrical connections and a module carrier. The electronics component and the electrical connections are mounted on the module carrier, and the module carrier is a cover configured to sealingly close off an interior of the gearbox.

9 Claims, 2 Drawing Sheets

(58) Field of Classification Search
CPC .. F16H 57/02; F16H 61/0006; F16H 61/0009; H05K 5/0082; B60R 16/0239
See application file for complete search history.

(56) References Cited

U.S. PATENT DOCUMENTS

| | | | | |
|---|---|---|---|---|
| 5,777,850 | A | * | 7/1998 | Jakob ................. B60R 16/0239 361/736 |
| 2008/0188339 | A1 | * | 8/2008 | Bader ................. F16H 61/0009 475/149 |
| 2010/0229677 | A1 | | 9/2010 | Murakami et al. |

FOREIGN PATENT DOCUMENTS

| | | | | |
|---|---|---|---|---|
| DE | 19629630 A1 | * | 9/1997 | ......... B60R 16/0239 |
| DE | 197 10 931 A1 | | 10/1997 | |
| DE | 19710931 A1 | * | 10/1997 | ........... F16H 1/0009 |
| DE | 10 2006 001 890 A1 | | 8/2007 | |
| DE | 10 2006 054279 A1 | | 5/2008 | |
| EP | 1 193 423 A2 | | 4/2002 | |
| EP | 1 705 068 A1 | | 9/2006 | |
| JP | H01-312252 A | | 12/1989 | |
| WO | 2010/108532 A2 | | 9/2010 | |

* cited by examiner

GEARBOX CONTROL MODULE

This application is a 35 U.S.C. §371 National Stage Application of PCT/EP2012/070174, filed on Oct. 11, 2012, which claims the benefit of priority to Serial No. DE 10 2011 088 031.3, filed on Dec. 8, 2011 in Germany, the disclosures of which are incorporated herein by reference in their entirety.

The disclosure relates to a gearbox control module and to a gearbox for a vehicle.

BACKGROUND

For the control of automatic gearboxes, use is made of electronic controllers which are either arranged in the interior of the gearbox housing (integrated control unit) or are mounted onto the gearbox housing from the outside (attachment control unit).

Attachment control units can have the advantage over integrated control units that they are subjected to lower temperatures and can thus be designed to be cheaper. It can however be a disadvantage that attachment control units take up a very large amount of structural space in the engine bay, and the outlay for leading electrical lines from the outside to the sensors and actuators situated in the interior of the gearbox is higher.

Integrated control units are generally constructed as so-called electronic control modules and may comprise an electronic circuit or an electronics component ("transmission control unit", TCU), sensors, at least one plug connection for connecting to the vehicle wiring loom, and electrical interfaces for the activation of actuators.

SUMMARY

It is the object of the disclosure to provide a gearbox control module which is easy to construct and easy to cool.

Said object is achieved by means of the subject matter of the disclosure. Further embodiments of the disclosure will emerge from the claims and from the following description.

One aspect of the disclosure relates to a gearbox control module for a gearbox.

In one embodiment of the disclosure, the gearbox control module comprises an electronics component with an electronic circuit for controlling the gearbox, electrical connections for example for connecting the electronics component to a wiring loom (for example in the engine bay) and/or for connecting the electronics component to the gearbox (for example via lines in the interior of the gearbox) and a module carrier on which the electronics component and the electrical connections are mounted. The module carrier is designed as a cover for sealingly closing off a gearbox interior.

In other words, the module carrier can simultaneously perform the function of a cover or of an oil pan for the gearbox. It is possible in this way for one component (cover or oil pan) to be omitted, and it is ensured that an outer side of the gearbox control module is situated in the relatively cool engine bay. Since the gearbox control module can also perform the function of a cover and some of its components are arranged in the interior of the gearbox, it is possible for the gearbox control module to have a small structural space requirement in the engine bay. With the gearbox control module, the outlay in terms of assembly and the number of individual parts required can be reduced.

Here, the low cabling outlay for a control unit integrated into the gearbox can be maintained: in general, it is merely necessary for the electrical lines from the electronics component (TCU) to the vehicle wiring loom to be led out of the gearbox interior into the engine bay in a sealed manner. This may be achieved for example by means of a gearbox plug connector.

The module carrier has the function of mechanically holding and supporting all of the components of the gearbox control module. The module carrier may be produced from plastic or from a metallic substrate (for example aluminum). With the covering of the gearbox by means of the module carrier, it can be achieved that the gearbox interior is separated from the engine bay in a manner impermeable to gearbox oil. The module carrier may be of oil-impermeable design and has, for example, no bores or other cutouts that are not closed off.

In one embodiment of the disclosure, the module carrier comprises a module carrier plate. The cover can thus form a substantially areal lid which can be mounted on the gearbox by way of a flange of the gearbox housing. The module carrier or the module carrier plate may thus have an inner surface facing toward the gearbox interior and an outer surface facing toward the engine bay. Some of the components of the gearbox control module, which are intended to be arranged in the interior of the gearbox, may be mounted on the inner surface. By way of the outer surface, the gearbox control module can release heat into the engine bay.

In one embodiment of the disclosure, the gearbox control module comprises a gearbox plug connector for the connection of a wiring loom to the gearbox control module. The gearbox plug connector is integrated into the module carrier for example through an opening or cutout in the module carrier. In this way, the gearbox plug connector can be installed already during the production of the gearbox control module, without mechanical tolerance compensation.

With the integrated gearbox plug connector, it is also possible for the mechanical outlay for the connection to the vehicle wiring loom to be reduced. Tolerance compensation that is required for conventional control units for the installation of the plug connector during the installation of the gearbox control module into the gearbox housing can be dispensed with, because the plug connector can be integrated directly in the module carrier.

The gearbox plug connector normally has the function of producing an interface from the electronics component (TCU) in the gearbox interior to the vehicle wiring loom in the engine bay.

The plug connector may be installed, as a separate part, into the module carrier plate. In the case of the module carrier being formed from plastic, the plug connector may also be injection-molded directly into the module carrier.

In one embodiment of the disclosure, the gearbox plug connector, as a separate part, is installed sealingly into a cutout in the module carrier.

In one embodiment of the disclosure, the gearbox plug connector is injection-molded into the module carrier.

In one embodiment of the disclosure, the electronics component is arranged on an inner side of the module carrier and the electronics component is thermally connected to the module carrier. The gearbox control module can utilize the low ambient temperature of the engine bay for the cooling of the electronics of the electronics component. The electronics component (TCU) may be thermally connected to the module carrier such that power losses can be dissipated out into the relatively cool engine bay.

The cooling surface of the gearbox control module (for example the outer side of the module carrier) may be situated outside the gearbox. Via the module carrier, the heat can be released to the relatively cool engine bay environment. This can result in significantly lower outlay for the cooling of the electronics.

The electronics component (TCU) and the electrical connections thereof may be arranged in the interior of the gearbox. Accordingly, it is possible for all components to be connected to interfaces within the gearbox with low cabling outlay.

Aside from the electronics component (TCU) and the gearbox plug connector, it is possible for electrical connections, sensors and an intermediate plug connector to be integrated into the gearbox control module: said elements may be installed on the inner side of the module carrier. The electrical connection means and/or the electrical connections may also serve for the connection of the components of the gearbox control module to one another. The intermediate plug connector may be used for the connection of an electrical line from the interior of the gearbox.

In one embodiment of the disclosure, the module carrier is in the form of a printed circuit board or an insert-molded lead frame. In this way, the functions of the components of electrical connection means (that is to say the electrical connections) and module carrier can be integrated in one component. Said component performs the function of the cover of the gearbox. For example, in this embodiment, the gearbox plug connector is likewise integrated into said component.

In one embodiment of the disclosure, a motor control component for an electric motor of the gearbox is mounted on an outer side of the module carrier. If an electric motor is required for the gearbox, it may be expedient for the electronic components for the actuation thereof to be mounted on the outer side of the gearbox control module. Aside from the lower temperatures, this may have the advantage that said components do not need to be protected from gearbox oil. Since said components are normally connected in series in the electrical line, the number of lines that are led into the gearbox interior in an oil-impermeable manner does not need to change.

A further aspect of the disclosure relates to a gearbox for a vehicle, for example an automatic gearbox.

In one embodiment of the disclosure, the gearbox comprises a housing with an opening (for example for the leadthrough of electrical lines into an interior of the gearbox) and comprises a gearbox control module, such as is described above and below, which sealingly closes off the opening.

The gearbox control module can be produced by a supplier independently of the final assembly process for the gearbox. The gearbox manufacturer can install the gearbox control module into its gearbox in a simple manner. Since the opening is also closed off when the gearbox control module is installed, the assembly process is simplified.

In one embodiment of the disclosure, the gearbox also comprises a hydraulics control module. The gearbox may comprise hydraulic components which are actuated by the hydraulics module, which in turn can be actuated by the gearbox control module. The opening in the gearbox housing may be delimited by a flange to which the gearbox control module is connected. The hydraulics control module may be mounted on the flange between the gearbox control module and the opening. In this way, the hydraulics control module is installed in a space-saving manner in the gearbox so as to be covered by the gearbox control module.

In this way, the positioning of the gearbox control module in the gearbox can also be simplified because the gearbox control module is connected directly to the gearbox housing, and is not connected indirectly to the gearbox housing via the hydraulics control module.

Exemplary embodiments of the disclosure will be described in detail below with reference to the appended figures.

BRIEF DESCRIPTION OF THE DRAWINGS

Identical or similar parts are basically denoted by the same reference signs.

DETAILED DESCRIPTION

Figure 1:
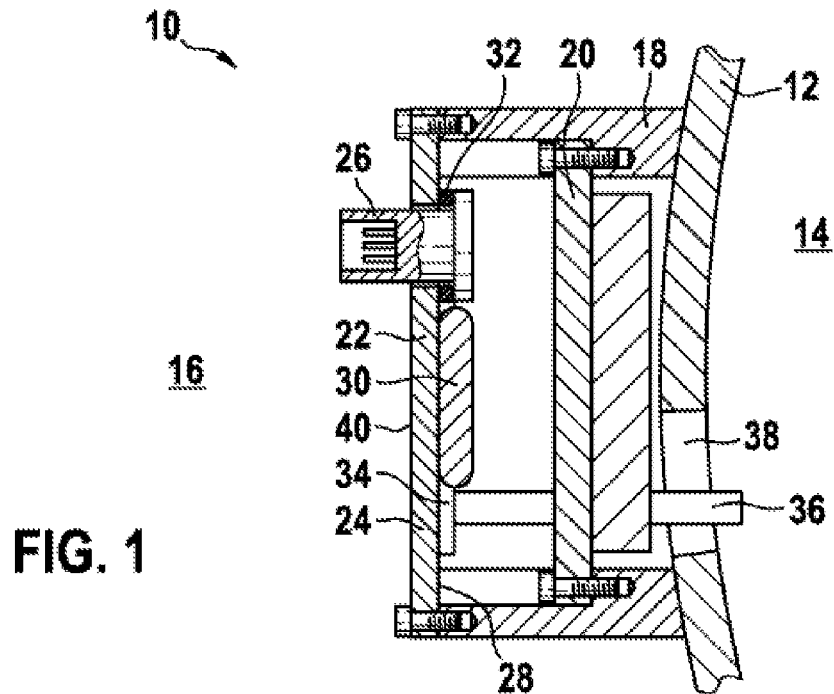
FIG. 1 shows a detail from a gearbox according to one embodiment of the disclosure.

FIG. 1 shows a detail of a gearbox 10 which is enclosed by a gearbox housing 12. The gearbox housing 12 divides an interior 14 of the gearbox 12 from an engine bay 16.

The gearbox housing 12 comprises a two-step flange 18, in the interior of which there is installed a hydraulics control module 20. The hydraulics control module 20 is seated on an internal shoulder of the flange 18 and is screwed to the flange 18 there. The gearbox 10 can be hydraulically actuated by means of the hydraulics control module 20 arranged in the interior of the gearbox housing 12. Instead of hydraulic actuation, an electromechanical actuation system may also be used for the gearbox.

At an external shoulder of the flange 18, a gearbox control module 22 is seated on the flange 18 and is screwed to the flange 18 there.

The gearbox control module 22 comprises a carrier plate into which there is integrated a gearbox plug connector 26, and on the inner side 28 of which there is mounted an electronics component (TCU) 30. arranged in the interior of the gearbox housing.

The gearbox plug connector 26 is led through a cutout or opening in the carrier plate 24 and is installed on the carrier plate 24 by means of a sealing ring 32 such that the opening is closed off in an oil-impermeable manner. By means of the gearbox plug connector 26, the gearbox control module 22 can be electrically connected to a wiring loom of the vehicle in which the gearbox 10 is installed.

The electronics component 30 and an electrical connection means 34 with electrical lines 34 are mounted on the inner side 28 of the gearbox control module 22. A sensor 36 and an intermediate plug connector may also be mounted there. The sensor 36 projects through an opening 38 in the gearbox housing 12, through which opening electrical lines can also be led into the interior of the gearbox 10, and which opening is surrounded by the flange 18.

On the inner side of the gearbox control module 22, there may also be mounted on the gearbox control module 22 an intermediate plug connector, for connecting to an electrical line in the interior of the gearbox 10, and an actuator contact, for connecting to an actuator of the gearbox 10.

Components, such as for example the components 20, 30, 34, 36, in the gearbox interior 14 are situated entirely or partially directly in the gearbox oil (ATF) and may be exposed to the temperatures (−40 . . . +150° C.) that prevail in the gearbox 10. Components outside the gearbox 10 in the engine bay 16 may be exposed to temperatures of up to approximately 120° C. An outer surface 40 of the carrier plate 24 can thus serve as a cooling surface for the gearbox control module 22. For better heat conduction, the electronics component is connected in thermally conductive fashion to the carrier plate 24 and can be cooled by the latter.

Figure 2:
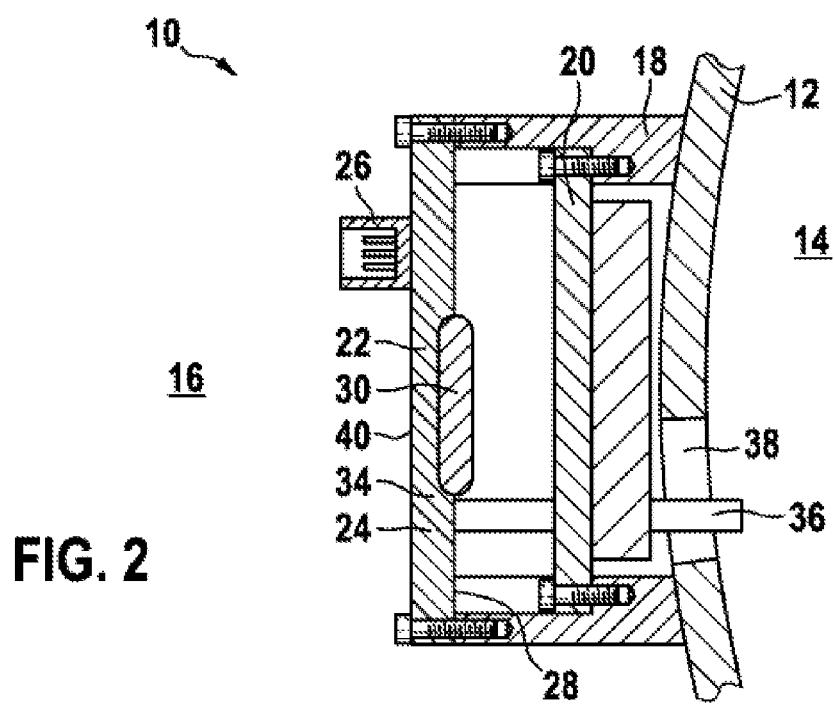
FIG. 2 shows a detail from a gearbox according to a further embodiment of the disclosure.

FIG. 2 shows a gearbox control module 22 in which the electrical connections 34 are integrated into the carrier plate 24. The gearbox plug connector 26 and the electronics component 30 are cast into the carrier plate 24.

Figure 3:
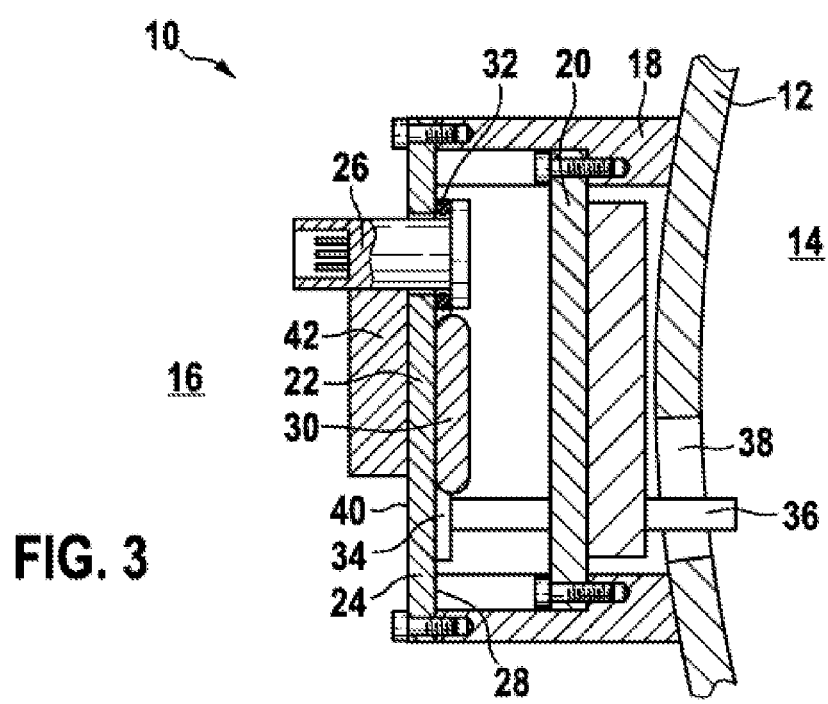
FIG. 3 shows a detail from a gearbox according to a further embodiment of the disclosure.

FIG. 3 shows a gearbox control module 22, on the outer side 40 of which there is mounted a motor control component 42 which comprises actuation components for an electric motor of the gearbox 10. For the actuation of the motor, an input filter, and also a B6 bridge in the case of an EC motor, are required. The input filter is composed of capacitors, coils and field-effect transistors.

It is additionally pointed out that the expression "comprising" does not exclude other elements or steps, and the expressions "a" or "an" do not exclude a multiplicity. Furthermore, it is pointed out that features or steps that have been described with reference to one of the above exemplary embodiments may also be used in combination with other features or steps of other exemplary embodiments described above. Reference signs in the claims are not to be regarded as being restrictive.

The invention claimed is:

1. A gearbox control module for a gearbox, the gearbox control module comprising:
    an electronics component with an electronic circuit configured to control the gearbox;
    electrical connections connected to the electronics component;
    a module carrier having an inner surface facing toward a gearbox interior and an opposite facing outer surface;
    a motor control component configured to actuate an electric motor, the motor control component mounted directly onto the outer surface of the module carrier; and
    a gearbox plug connector configured to connect a wiring loom to the gearbox control module, the gearbox plug connector extending from the outer surface of the module carrier,
    wherein the electronics component and the electrical connections are mounted directly onto the inner surface of the module carrier; and
    wherein the module carrier is a cover configured to sealingly close off the gearbox interior.

2. The gearbox control module as claimed in claim 1, wherein the module carrier includes a module carrier plate.

3. The gearbox control module as claimed in claim 1, wherein the gearbox plug connector is integrated into the module carrier.

4. The gearbox control module as claimed in claim 3, wherein the gearbox plug connector is sealingly positioned into a cutout in the module carrier.

5. The gearbox control module as claimed in claim 3, wherein the gearbox plug connector is injection-molded into the module carrier.

6. The gearbox control module as claimed in claim 1, wherein:
    the electronics component is thermally connected to the module carrier.

7. The gearbox control module as claimed in claim 1, wherein the module carrier is formed as a printed circuit board or an insert-molded lead frame.

8. A gearbox for a vehicle, the gearbox comprising:
    a housing defining an opening; and
    a gearbox control module, including:
        an electronics component with an electronic circuit configured to control the gearbox;
        electrical connections connected to the electronics component;
        a module carrier having an inner surface facing toward a gearbox interior and an opposite facing outer surface;
        a motor control component configured to actuate an electric motor, the motor control component mounted directly onto the outer surface of the module carrier; and
        a gearbox plug connector configured to connect a wiring loom to the gearbox control module, the gearbox plug connector extending from the outer surface of the module carrier,
    wherein the electronics component and the electrical connections are mounted directly onto the inner surface of the module carrier; and
    wherein the gearbox control module is configured to sealingly close off the opening.

9. The gearbox as claimed in claim 8, further comprising:
    a hydraulics control module,
    wherein the opening is delimited by a flange;
    wherein the gearbox control module is connected to the flange; and
    wherein the hydraulics control module is mounted on the flange between the gearbox control module and the opening.

* * * * *